(12) United States Patent
Wang et al.

(10) Patent No.: US 6,386,274 B1
(45) Date of Patent: May 14, 2002

(54) HEAT SINK ASSEMBLY

(75) Inventors: Jing Liang Wang, Shenzhen (CN); Ming Hung Yang; Cheng-Chi Lee, both of Taipei (TW)

(73) Assignee: Foxconn Precision Components Co., Ltd., Taipei Hsien ( * ) Notice: Subject to any disclaimer, the term of this patent is extended or adjusted under 35 U.S.C. 154(b) by 0 days.

(21) Appl. No.: 09/894,933

(22) Filed: Jun. 28, 2001

(51) Int. Cl.$^7$ ................................................ H05K 7/20
(52) U.S. Cl. ...................... 165/80.3; 165/185
(58) Field of Search ................ 361/704, 710; 257/719, 722; 165/80.3, 185; 174/16.3

(56) References Cited

U.S. PATENT DOCUMENTS

| | | | | |
|---|---|---|---|---|
| 4,978,638 A | * | 12/1990 | Buller et al. | 156/91 |
| 5,397,919 A | * | 3/1995 | Tata et al. | 257/706 |
| 5,463,529 A | * | 10/1995 | Chia et al. | 165/185 |
| 5,566,052 A | * | 10/1996 | Hughes | 174/35 GC |
| 5,596,485 A | * | 1/1997 | Glenn et al. | 174/16.3 |
| 5,708,564 A | * | 1/1998 | Lin | 165/185 |
| 6,293,331 B1 | * | 9/2001 | Wang | 165/185 |

* cited by examiner

Primary Examiner—Allen Flanigan
(74) Attorney, Agent, or Firm—Wei Te Chung

(57) ABSTRACT

A heat sink assembly includes a heat sink (10), a fixing device (40), and a fan (30). The heat sink has a base (16), an engaging body (12), an annular groove (14) defined in the engaging body, and a plurality of radial fins (18). A plurality of external teeth (122) extends from the engaging body. A protrusion (20) extends outwardly from one fin, and an engaging space (22) is defined adjacent the protrusion. A central space (24) between the fins accommodates the fan. The fixing device has a frame (42) defining an engaging opening (44) and having a plurality of internal teeth (442). The internal teeth are engaged in the groove against the external teeth. The fixing device has a stop tab (52) accommodated in the engaging space, and a latch (54) extending from the stop tab. The stop tab abuts the protrusion, and the latch presses against the protrusion.

16 Claims, 4 Drawing Sheets

HEAT SINK ASSEMBLY

BACKGROUND OF THE INVENTION

1. Field of the Invention

The present invention relates to cooling of electronic devices, and particularly to heat sink assemblies with fixing devices for readily and firmly attaching a heat sink to an electronic device.

2. Related Art

Developments in today's highly information-intensive society have led to remarkable improvements in performances of electronic devices. During operation of many contemporary electronic devices, large amounts of heat are produced. Such heat must be efficiently removed from the electronic device, to prevent the system from becoming unstable or being damaged. Typically, a heat sink is attached to an outer surface of the device to facilitate removal of heat therefrom.

A conventional heat sink assembly often uses a clip to attach a heat sink to an electronic device. The clip is placed into a channel of the heat sink and presses a top surface of a base of the heat sink. However, the channel is a space which would otherwise be occupied by a number of heat-dissipating fins. This results in lower heat dissipation efficiency of the heat sink.

Another heat sink assembly uses a clip placed under the heat sink to attach the heat sink to the electronic device. An example of such assembly is disclosed in Taiwan Patent Application No. 83204483. The clip defines a circular opening with a screw thread thereat, to engage with a complementarily threaded disc-shaped base of a heat sink. Space available for heat-dissipating fins is not compromised. However, the manufacturing process requires machining of a thread at both the opening of the clip and at the base of the heat sink. This is unduly cumbersome and time-consuming. Furthermore, it is difficult to precisely adjust the amount of pressing force exerted by the heat sink on the electronic device. If the base is rotated downwardly too much, it can easily damage the electronic device. If the base is not rotated downwardly far enough, it will not firmly contact a top face of the electronic device. This reduces the efficiency of heat dissipation. Additionally, when the assembly is subjected to vibration, the engagement between the clip and the heat sink is prone to become loose over time. The base gradually loses firm contact with the top face of the electronic device.

Therefore, an improved means of securing a heat sink to an electronic device which overcomes the above problems is desired.

BRIEF SUMMARY OF THE INVENTION

Accordingly, an object of the present invention is to provide a heat sink assembly having a fixing device which firmly and reliably attaches a heat sink to a CPU.

Another object of the present invention is to provide a heat sink assembly which readily attaches a heat sink to a CPU and which allows ready detachment of the heat sink from the CPU.

To achieve the above-mentioned objects, a heat sink assembly comprises a heat sink, a fixing device, and a fan. The heat sink has a base, an engaging body, and an annular groove defined in a periphery of a topmost portion of the engaging body. A plurality of external teeth extends outwardly from a periphery of the engaging body. A plurality of radial fins extends upwardly from the base. A protrusion extends outwardly from a bottom portion of one fin, and an engaging space is defined adjacent the protrusion. The fins cooperatively define a central space for accommodating the fan therein. The fixing device has a frame defining an engaging opening. A plurality of internal teeth extends inwardly from the frame at the opening. The internal teeth are engaged in the groove against the external teeth of the heat sink. The fixing device also has a stop tab accommodated in the engaging space, and a latch extending coplanarly and horizontally from the stop tab. The stop tab abuts the protrusion, and the latch presses against the protrusion.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
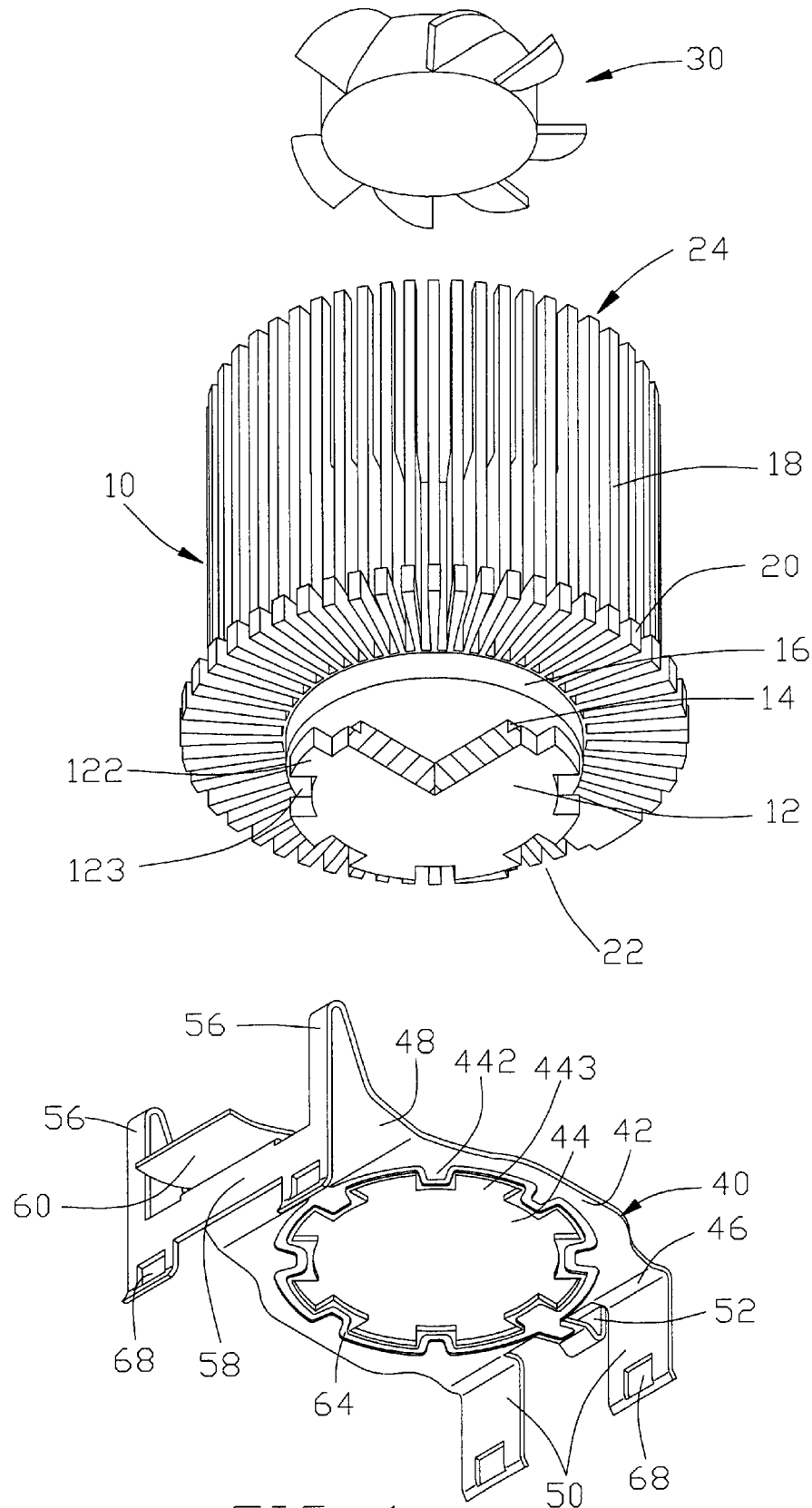
FIG. 1 is an exploded view of a heat sink assembly in accordance with the present invention, together with a fan.
Figure 4:
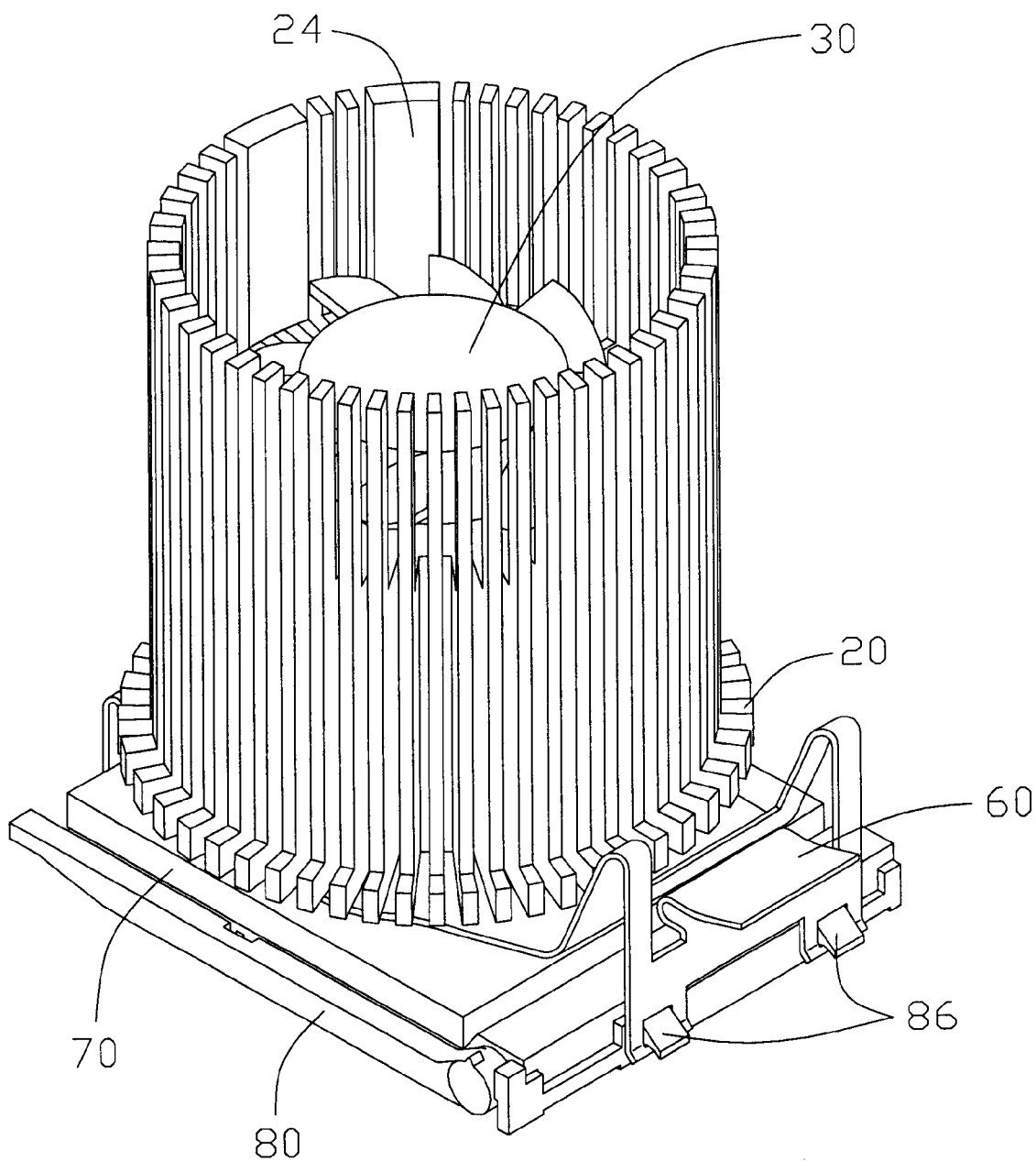
FIG. 4 is a perspective view of an assembled heat sink assembly of FIG. 1 attached to a socket on which a CPU is mounted, thereby pressing the heat sink against the CPU.

Referring to FIG. 1, a heat sink assembly in accordance with the present invention comprises a heat sink 10, a fixing device 40, and a fan 30. Referring to FIG. 4, the heat sink assembly is attached to a CPU 70 mounted on a socket 80. A pair of spaced catches 86 is formed on each of opposite sides of the socket 80.

The heat sink 10 has a disc-shaped base 16, and a generally disc-shaped engaging body 12. An annular groove 14 is defined in a periphery of a topmost portion of the engaging body 12. A plurality of external teeth 122 extends radially outwardly from a periphery of the engaging body 12. The external teeth 122 are spaced evenly apart, and each contiguous pair of external teeth 122 are separated by an external gap 123. A plurality of radial fins 18 extends upwardly from an upper face of the base 16. The radial fins 18 comprise a first bulky fin (not labeled), a second bulky fin (not labeled), and a plurality of L-shaped thin fins (not labeled). The first and second bulky fins are separated from each other by a plurality of thin fins. Each first and second bulky fin resembles a combination of a plurality of thin fins, but with outmost vertical portions thereof integrally joined together to form an outer wall (not labeled). A protrusion 20 extends horizontally outwardly from a bottom portion of each thin fin, except the thin fins which are disposed between the bulky fins. A protrusion 20 also extends horizontally outwardly from a bottom portion of the first bulky fin, at a position farthest from the second bulky fin (see FIG. 3). A protrusion (not labeled) also extends horizontally outwardly from a bottom portion of the second bulky fin, at a position farthest from the first bulky fin. An engaging space 22 (best seen in FIG. 3) is thereby defined between the protrusion 20 of the first bulky fin and the protrusion (not labeled) of the second bulky fin. The radial fins 18 cooperatively define a central receiving space 24 at top portions of the radial fins 18, for accommodating the fan 30 therein.

The fixing device 40 has a horizontal frame 42, which defines an engaging opening 44 in a center thereof. A plurality of internal teeth 442 extends radially inwardly from the frame 12 at a periphery of the engaging opening 44, corresponding to the external gaps 123 of the engaging body 12. Each contiguous pair of internal teeth 442 is separated by an internal gap 443. A first spring portion 46 and a second spring portion 48 extend upwardly and outwardly from opposite sides of the frame 42 respectively. A pair of spaced resilient first fixing arms 50 depends from a topmost end of the first spring portion 46. A stop tab 52 extends upwardly from a center of the first spring portion 46, generally between upper portions of the first fixing arms 50. A latch 54 (see FIG. 3) extends coplanarly and horizontally from a top end of the stop tab 52. A pair of spaced resilient second fixing arms 56 extends upwardly and then downwardly from the second spring portion 48. A connecting beam 58 connects lower portions of the second fixing arms 56. A handling tab 60 extends horizontally from an upper edge of the connecting beam 58 toward the frame 42, and then doubles back over itself to extend horizontally outwardly and protrude beyond the upper edge of the connecting beam 58. An aperture 68 is defined in the vicinity of a distal end of each first fixing arm 50 and each second fixing arm 56. A reinforcing rib 64 is formed on a bottom surface of the frame 42 near edges thereof adjacent the engaging opening 44, and is also integrally formed on bottom surfaces of the first and second spring portions 46, 48.

Figure 2:
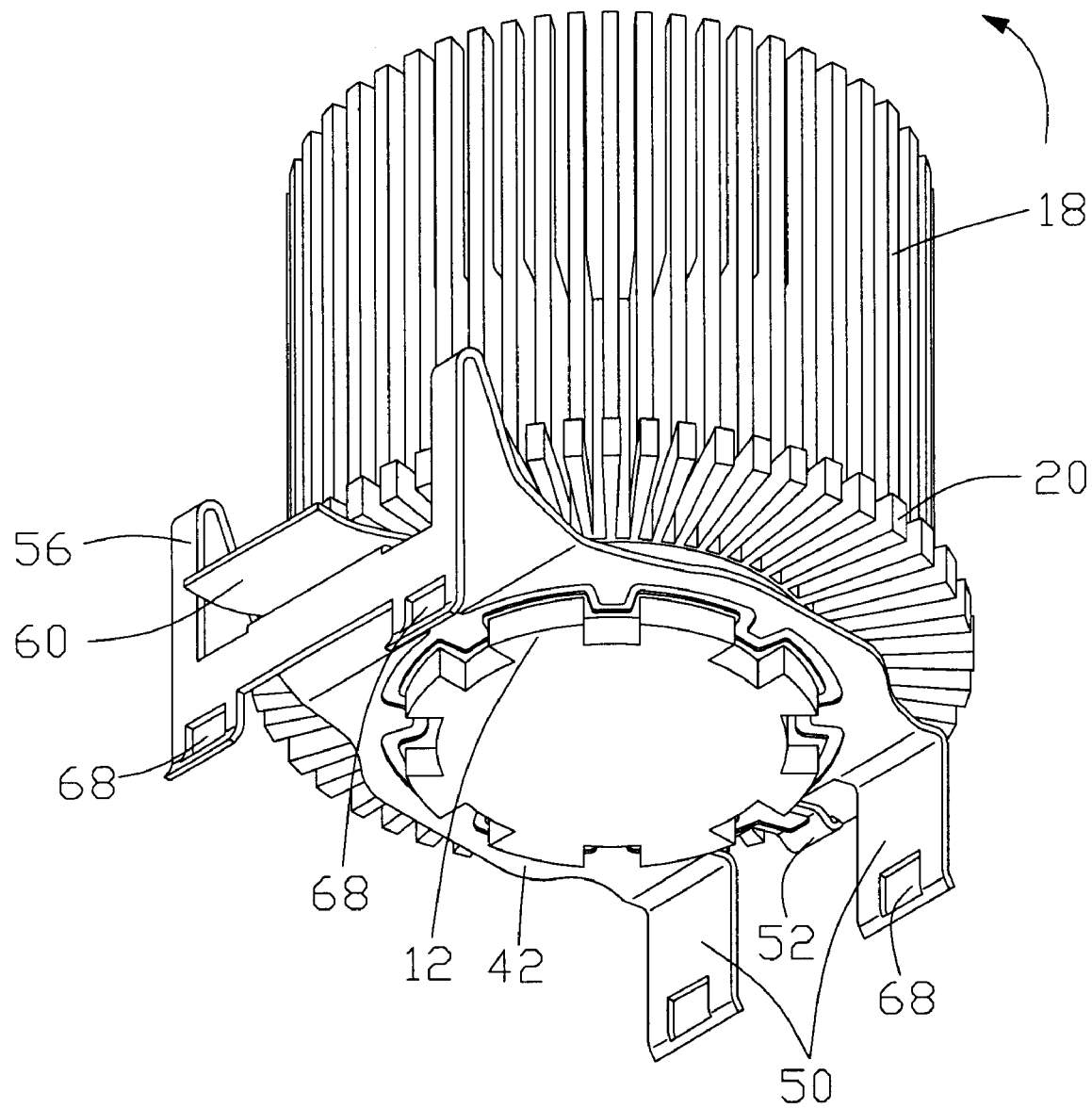
FIG. 2 is a partly assembled view of a heat sink and a fixing device of the heat sink assembly of FIG. 1, but not showing the fan.
Figure 3:
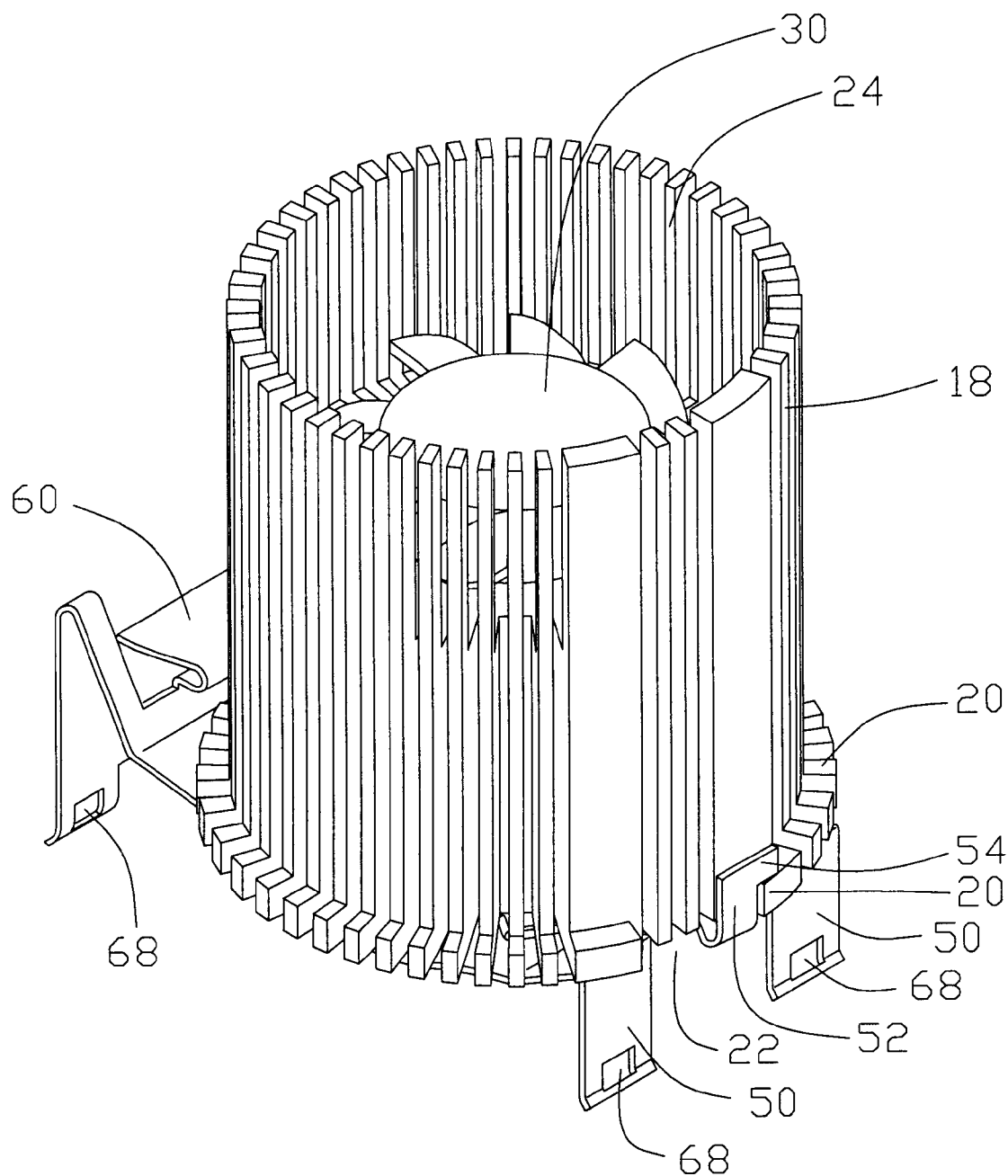
FIG. 3 is an assembled view of FIG. 1, but viewed from another aspect.

Referring particularly to FIGS. 2–4, in assembly, the engaging body 12 of the heat sink 10 is centered above the fixing device 40, such that the external teeth 122 of the engaging body 12 oppose the internal gaps 443 of the fixing device 40. The external teeth 122 are passed through the internal gaps 443, and the frame 42 of the fixing device 40 is accommodated around a perimeter of the groove 14 of the engaging body 12 (see FIG. 2). The stop tab 52 of the fixing device 40 is accommodated in the engaging space 22 of the heat sink 10. Then, the fixing device 40 is rotated (see FIG. 2) until the stop tab 52 thereof abuts against the protrusion 20 of the first bulky fin of the heat sink 10. In this position, the latch 54 of the fixing device 40 abuts a top portion of the protrusion 20 of the first bulky fin (see FIG. 3). The external teeth 122 of the engaging body 12 abut the corresponding internal teeth 442 of the fixing device 40. The fixing device 40 is thereby prevented from separating from the heat sink 10.

The combined heat sink 10 and fixing device 40 is then placed onto the CPU 70. A bottom surface of the engaging body 12 abuts against a top surface of the CPU 70. The apertures 68 of the first fixing arms 50 loosely receive the corresponding catches 86 of the socket 80. Then, the handling tab 60 of the fixing device 40 is depressed to drive the apertures 68 of the second fixing arms 56 to engagingly receive the corresponding catches 86 of the socket 80. The latch 54 of the fixing device 40 thereby presses against the top portion of the protrusion 20 of the first bulky fin of the heat sink 10. The fan is then mounted inside the central receiving space 24 of the heat sink 10 by conventional means.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink assembly comprising:
  a heat sink comprising an engaging body at a bottom thereof, a plurality of external teeth extending outwardly from a periphery of the engaging body, and a groove defined in a topmost portion of the engaging body; and
  a fixing device received in the groove and attaching the heat sink to a CPU, the fixing device comprising a frame defining an engaging opening complementarily receiving the engaging body, and at least one first fixing arm and at least one second fixing arm depending away from opposite sides of the frame, wherein a plurality of internal teeth extends inwardly from an edge of the frame at the opening.

2. The heat sink assembly as described in claim 1, wherein the heat sink further comprises a disc-shaped base above the engaging body, and wherein a plurality of radial fins extends upwardly from a top face of the base.

3. The heat sink assembly as described in claim 2, wherein a protrusion extends outwardly from a bottom portion of one fin, and an engaging space is defined adjacent the protrusion.

4. The heat sink assembly as described in claim 3, wherein the fixing device further forms a stop tab extending from one of opposite sides of the frame, a latch extends coplanarly and horizontally from a top end of the stop tab, and wherein the stop tab is accommodated in the engaging space and abuts the protrusion, and the latch presses against a top portion of the protrusion.

5. The heat sink assembly as described in claim 2, wherein the fins cooperatively define a central receiving space at upper portions thereof.

6. The heat sink assembly as described in claim 5, further comprising a fan attachably received in the receiving space of the fins.

7. The heat sink assembly as described in claim 1, wherein the fixing device further comprises first and second spring portions extending upwardly and outwardly from the opposite sides of the frame, the at least one first fixing arm depends from the first spring portion, and the at least one second fixing arm extends upwardly and then downwardly from the second spring portion.

8. The heat sink assembly as described in claim 7, wherein an aperture is defined in an end portion of each first and second fixing arm, for engagingly receiving a corresponding catch of a socket.

9. The heat sink assembly as described in claim 7, wherein the fixing device comprises a pair of first fixing arms and a pair of second fixing arms at the first and second spring portions respectively, the stop tab extends from the first spring portion between the first fixing arms, a beam connects the second fixing arms, and a handling portion is formed at the beam.

10. The heat sink assembly as described in claim 1, wherein a reinforcing rib is formed on the frame around a periphery of the engaging opening, and is further integrally formed on the first and second spring portions.

11. A heat sink assembly adapted to be attached to a CPU, comprising:
  a heat sink comprising a base, a plurality of radially arranged fins extending upwardly from a top face of the base, external splining located below the base and comprising a plurality of external teeth, and a groove defined in a periphery of the heat sink between the base and the external splining; and
  a fixing device having a frame and a plurality of resilient arms depending from the frame adapted to engage with a socket, the frame having internal splining comprising a plurality of internal teeth receivable in the groove of the heat sink and horizontally rotatable a predetermined angle to make the internal teeth of the internal splining align with the external teeth of the external splining such that the frame presses the heat sink onto a CPU, the fixing device further having a stop tab engaging with the heat sink to prevent the fixing device from rotating beyond the predetermined angle.

12. The heat sink assembly as described in claim 11, wherein a protrusion extends outwardly from a bottom portion of one fin, and wherein an engaging space is defined adjacent the protrusion, the engaging space accommodating the stop tab of the fixing device.

13. The heat sink assembly as described in claim 12, wherein a latch extends coplanarly and horizontally from a top end of the stop tab to press against the protrusion.

14. A heat sink assembly comprising:

a heat sink comprising a base, an engaging body and a groove defined in a periphery of a topmost portion of the engaging body, wherein the base comprises a plurality of fins generally covering the base and extending upwardly therefrom; and a fixing device received in the groove and attaching the heat sink to an electronic device, the fixing device comprising a frame defining an engaging opening complementarily receiving the engaging body, a stop tab having a latch fixedly engaging with the heat sink, and at least a pair of resilient arms depending from opposite sides of the frame.

15. The heat sink assembly as described in claim 14, wherein a protrusion extends outwardly from a bottom portion of one fin, and wherein an engaging space is defined adjacent the protrusion.

16. The heat sink assembly as described in claim 15, wherein the latch extends coplanarly and horizontally from a top end of the stop tab, and wherein the stop tab abuts the protrusion, and the latch presses against a top portion of the protrusion.

* * * * *